US008169028B2

(12) United States Patent
Ogura

(10) Patent No.: US 8,169,028 B2
(45) Date of Patent: May 1, 2012

(54) SEMICONDUCTOR DEVICE

(75) Inventor: Takashi Ogura, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 135 days.

(21) Appl. No.: 12/568,441

(22) Filed: Sep. 28, 2009

(65) Prior Publication Data

US 2010/0078709 A1 Apr. 1, 2010

(30) Foreign Application Priority Data

Sep. 29, 2008 (JP) ................................. 2008-250907

(51) Int. Cl.
 *H01L 23/62* (2006.01)
(52) U.S. Cl. ................................ 257/360; 257/E29.063
(58) Field of Classification Search .................. 257/360, 257/E29.063
 See application file for complete search history.

(56) References Cited

U.S. PATENT DOCUMENTS

| 7,288,816 | B2 * | 10/2007 | Kanda et al. .................. 257/343 |
| 2006/0061926 | A1 * | 3/2006 | Hiraga ............................ 361/56 |
| 2007/0002509 | A1 * | 1/2007 | Kumagai et al. ................. 361/56 |
| 2008/0001229 | A1 * | 1/2008 | Watanabe et al. ............. 257/360 |
| 2008/0135940 | A1 * | 6/2008 | Hashigami .................... 257/357 |

FOREIGN PATENT DOCUMENTS

JP 2005-235844 9/2005

* cited by examiner

*Primary Examiner* — Colleen Matthews
(74) *Attorney, Agent, or Firm* — Morrison & Foerster LLP

(57) ABSTRACT

In a conventional semiconductor device, protection of a to-be-protected element from a surge voltage is difficult because the to-be-protected element is turned on before a protection element due to variations in manufacturing conditions. In a semiconductor device of the present invention, a protection element and a MOS transistor have part of their structures formed under common conditions. N type diffusion layers of the protection element and the MOS transistor are formed in the same process, while the N type diffusion layer of the protection element has a larger diffusion width than the N type diffusion layer of the MOS transistor. With this structure, when a surge voltage is applied to an output terminal, the protection element is turned on before the MOS transistor, and thereby the MOS transistor is protected from an avalanche current.

10 Claims, 4 Drawing Sheets

SEMICONDUCTOR DEVICE

This application claims priority from Japanese Patent Application Number JP 2008-250907 filed on Sep. 29, 2008, the content of which is incorporated herein by reference in its entirety.

BACKGROUND OF THE INVENTION

1. Field of the Invention

The present invention relates to a semiconductor device having a protection element that prevents a breakdown caused by a surge voltage such as electrostatic discharge (hereinafter referred to as ESD).

2. Description of the Related Art

In one example, a conventional semiconductor element is known to include a protection element, which will be described below. FIG. 5 is a cross-sectional view illustrating the conventional semiconductor device.

As shown in FIG. 5, a P type epitaxial layer 42 is formed on a P type semiconductor substrate 41. On the epitaxial layer 42, an N type diffusion layer 43 is formed as a forming region of a lateral MOSFET (metal-oxide-semiconductor filed effect transistor) 49. On the N type diffusion layer 43, a P type diffusion layer 44 is formed as a back-gate region. On the P type diffusion layer 44, an N type diffusion layer 45 is formed as a source region, and an N type diffusion layer 46 is formed as a drain region. Moreover, on the P type diffusion layer 44, a gate oxide film 47 and a gate electrode 48 are formed. Thus, the lateral MOSFET 49 is formed. Note that a diffusion depth of the N type diffusion layer 43 is L1.

In addition, a protection element 50 is formed above the substrate 41 in order to protect the lateral MOSFET 49 from the ESD surge. The structure of the protection element 50 is described below. An N type diffusion layer 51 is formed in the epitaxial layer 42, the N type diffusion layer 51 having the same or slightly lower impurity concentration than the N type diffusion layer 43. A diffusion depth of the N type diffusion layer 51 is L2, and a relation of L2≦L1 is satisfied. An N type diffusion layer 52 is also formed in the epitaxial layer 42 so as to surround the N type diffusion layer 51. The N type diffusion layer 52 has an impurity concentration higher than the N type diffusion layer 51. A diffusion depth of the N type diffusion layer 52 is L3, and a relation of L3>L2 is satisfied. P type diffusion layers 53 and an N type diffusion layer 54 are formed in the N type diffusion layer 51. The diffusion layers 53 and 54 are shorted by an emitter electrode 55. A bottom surface electrode 56 is formed on the bottom surface of the substrate 41.

In the above structure, the protection element 50 includes a PNP transistor Tr3 and a PN diode D3 combined with each other. The PN diode D3 in the protection element 50 operates in avalanche mode prior to the lateral MOSFET 49. Then, an avalanche current causes the PNP transistor Tr3 to operate. This operation prevents the lateral MOSFET 49 from being destroyed by the ESD surge. This technology is described for instance in Japanese Patent Application Publication No. 2005-235844 (pages 5-7, FIG. 1).

In the conventional semiconductor device, the protection element 50 having the structure different from that of the lateral MOSFET 49 is formed to protect the lateral MOSFET 49 from the ESD surge. The protection element 50 and the lateral MOSFET 49 are formed above the same substrate 41. As described above, the N type diffusion layer 52 is formed so that an avalanche voltage of the PN diode D3 of the protection element 50 may be lower than an avalanche voltage of the lateral MOSFET 49.

However, in the conventional semiconductor device, the N type diffusion layer 43 and the N type diffusion layer 52 are formed in different process steps and on different conditions. The structure that determines an avalanche voltage of the lateral MOSFET 49 and the structure that determines an avalanche voltage of the protection element 50 do not share the same structure. Accordingly, there occurs a problem that variations in manufacturing conditions, such as mask misalignments and a time lag in thermal diffusion, cause the avalanche voltage of the lateral MOSFET 49 to be lower than the avalanche voltage of the PN diode D3 in the protection element 50, and that the lateral MOSFET 49 is consequently destroyed by the ESD surge.

SUMMARY OF THE INVENTION

The present invention has been made in consideration of the circumstances described above. A semiconductor device according to the present invention includes a MOS transistor and a protection element being connected to the MOS transistor in parallel and protecting the MOS transistor from a surge voltage. In the semiconductor device, the protection element includes a first diffusion layer having the same conductivity type as a back-gate diffusion layer of the MOS transistor, a second diffusion layer being formed in the first diffusion layer, the second diffusion layer having the same conductivity type as and a larger diffusion width than a source diffusion layer of the MOS transistor, and a third diffusion layer being formed to surround the first diffusion layer and having the same conductivity type as a drain diffusion layer of the MOS transistor. Moreover, an avalanche voltage between the first diffusion layer and the third diffusion layer of the protection element is equal to an avalanche voltage between the back-gate diffusion layer and the drain diffusion layer of the MOS transistor. Therefore, the present invention allows accomplishment of a structure in which the MOS transistor and the protection element have the avalanche voltages which are less likely to vary from each other even when manufacturing conditions vary.

DESCRIPTION OF THE INVENTION

Figure 1A:
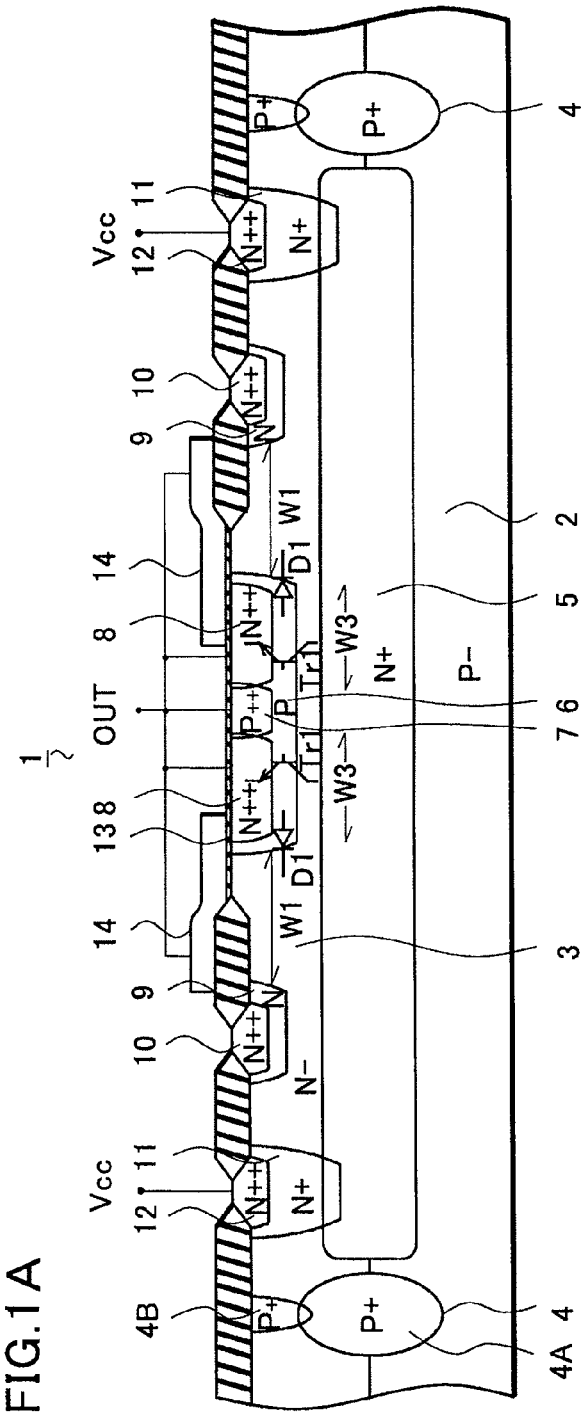
FIGS. 1A and 1B are cross-sectional views illustrating a semiconductor device according to a preferred embodiment of the present invention.
Figure 1B:
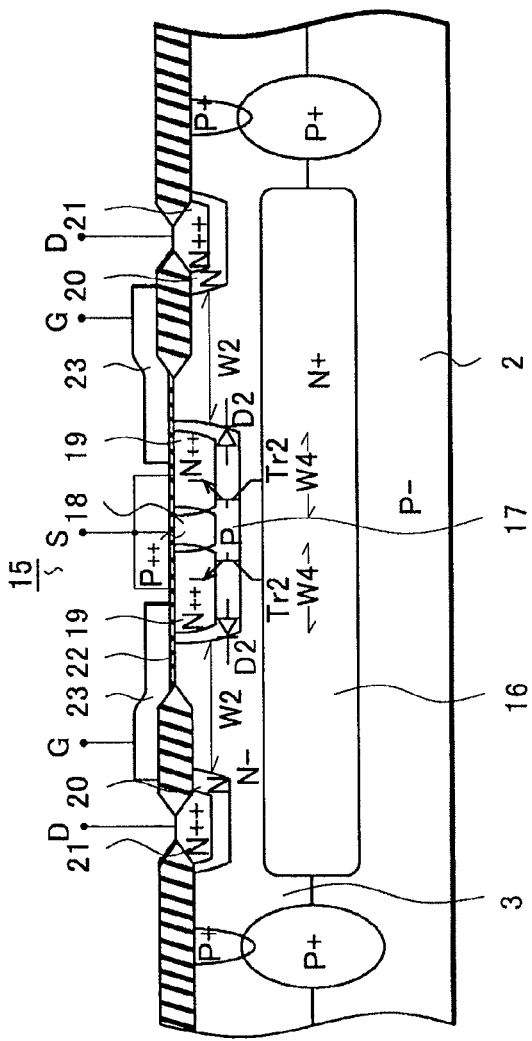
Figure 2:
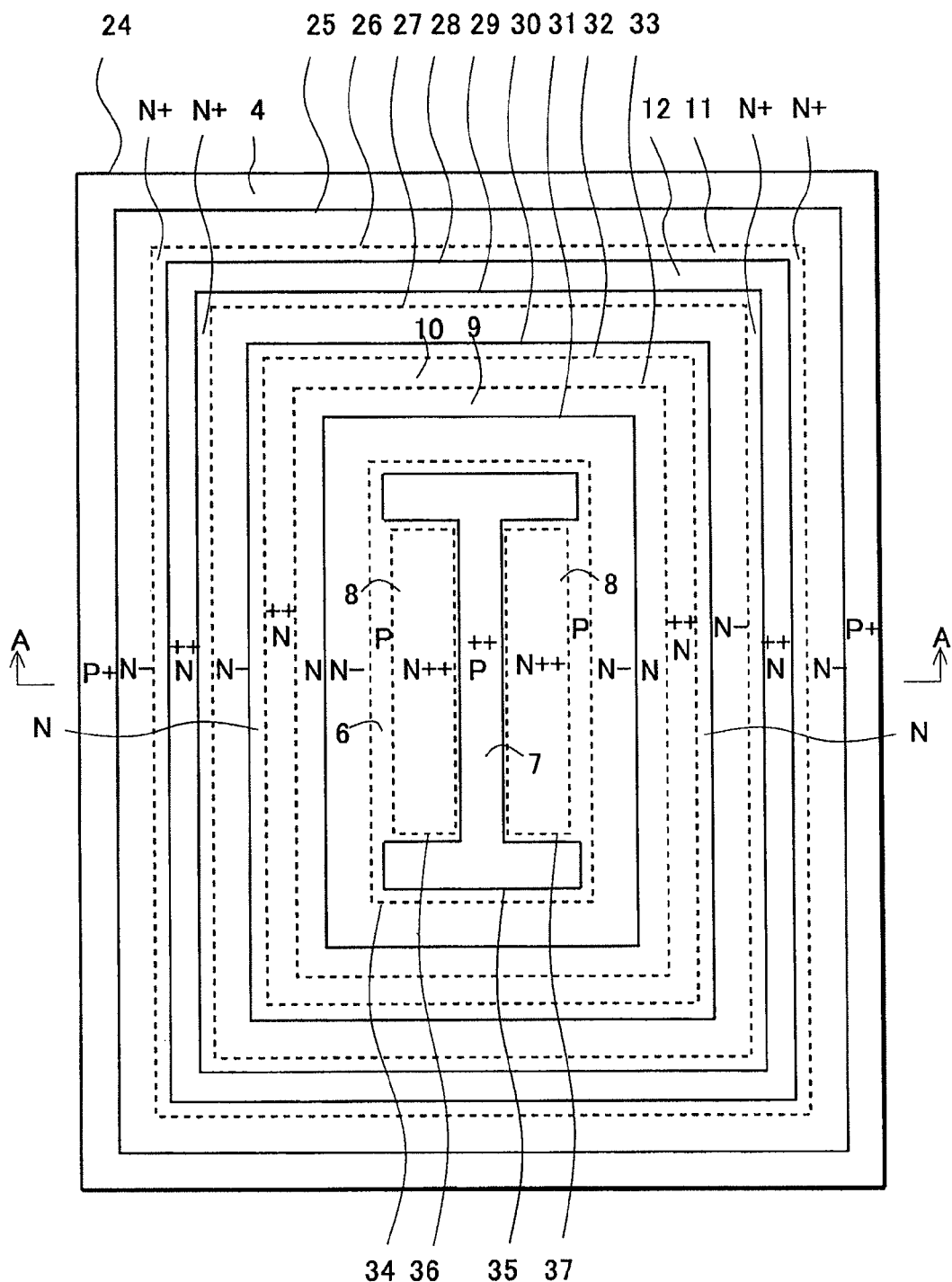
FIG. 2 is a plan view illustrating the semiconductor device according to the embodiment of the present invention.
Figure 3:
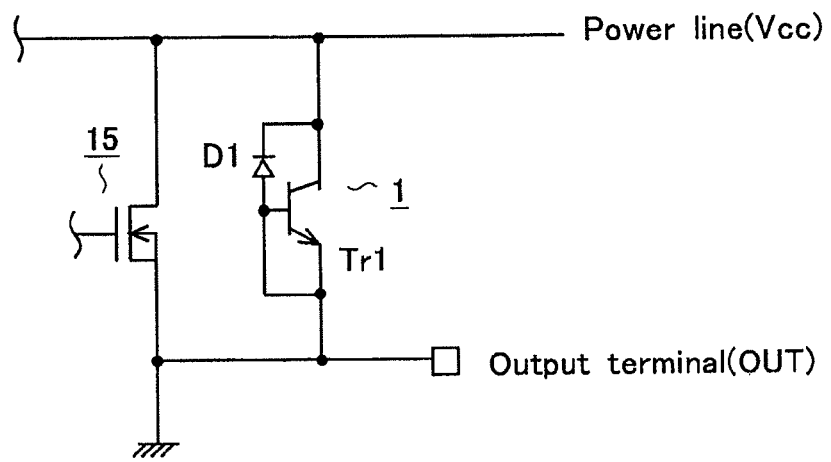
FIG. 3 is a circuit diagram illustrating the semiconductor device according to the preferred embodiment of the present invention.
Figure 4:
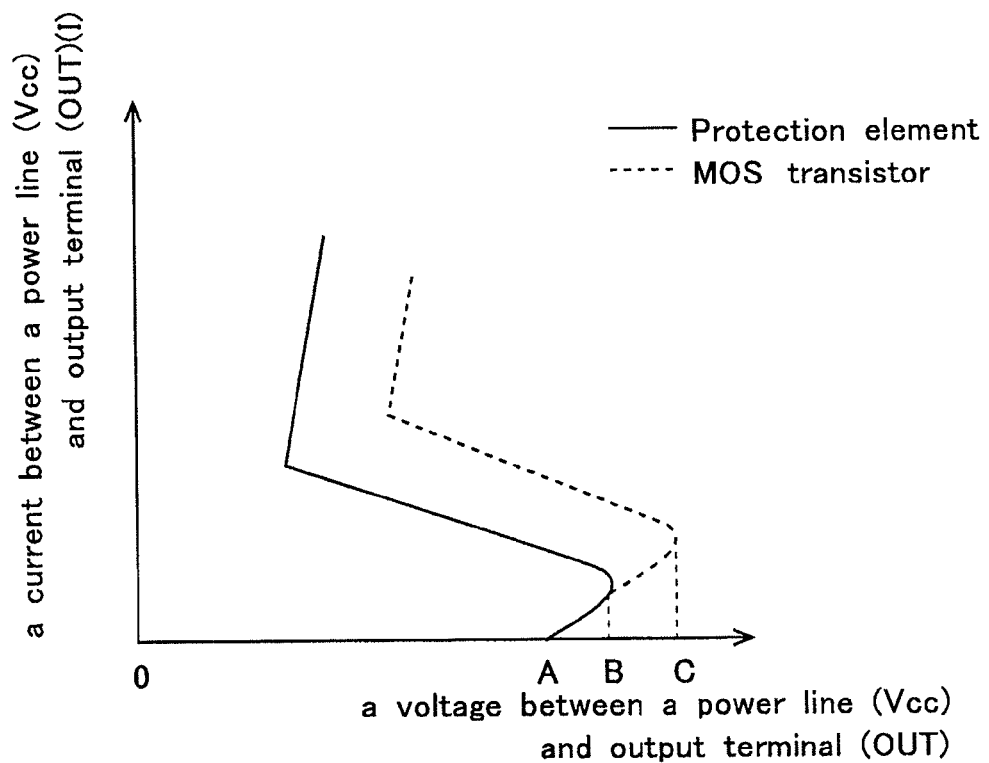
FIG. 4 is a diagram illustrating the semiconductor device according to the preferred embodiment of the present invention.
Figure 5:
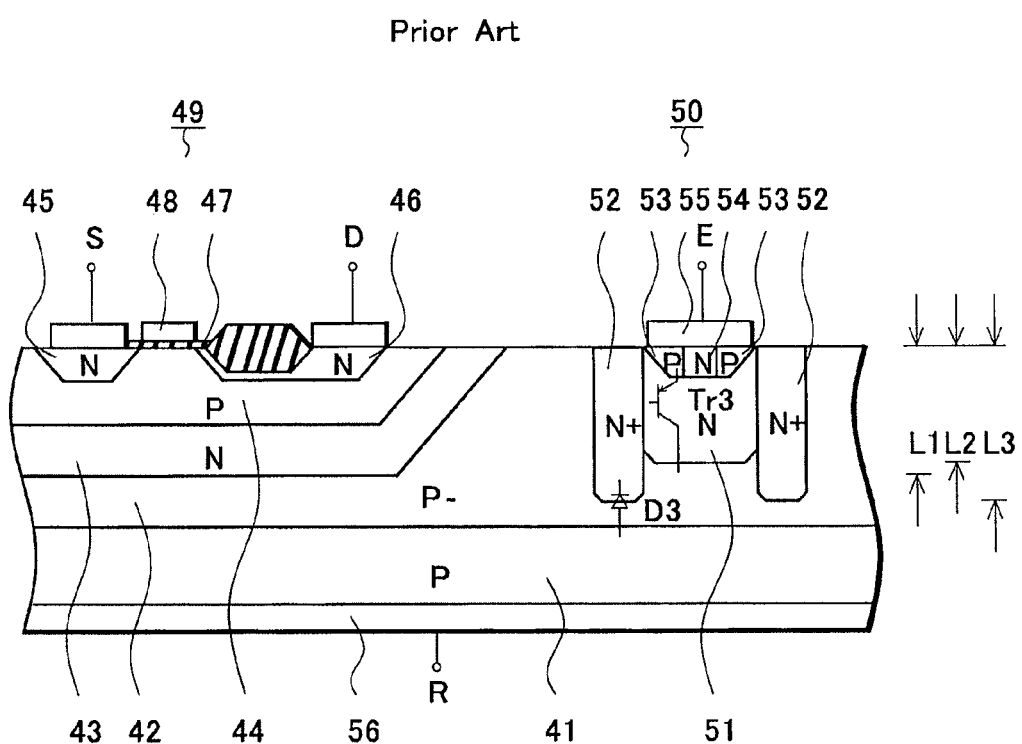
FIG. 5 is a cross-sectional view illustrating a semiconductor device according to a conventional embodiment.

A semiconductor device according to a preferred embodiment of the invention will be described in detail hereinbelow with reference to FIGS. 1A to 4. FIG. 1A is a cross-sectional view taken along the line A-A in FIG. 2, the view illustrating a protection element according to the embodiment. FIG. 1B is a cross-sectional view illustrating a MOS transistor as a to-be-protected element according to the embodiment. FIG. 2 is a plan view illustrating the protection element according to the embodiment. FIG. 3 is a view illustrating a circuit incorporated with the protection element. FIG. 4 is a view illustrating properties of the protection element according to the embodiment.

As shown in FIG. 1A, a protection element 1 is formed with use of the structure of an N channel type MOS transistor. In addition, since the protection element 1 is formed together with a MOS transistor 15 shown in FIG. 1B in the same forming process, the process for forming the protection element 1 will be described also using FIG. 1B as needed.

In the drawings, conductivity types are shown with variations. For example, conductivity types such as N−, N, N+ and N++ are shown in the drawings. These conductivity types belong in one general conductivity type. The conductivity types shown in the drawing, such as P−, P, P+ and P++ belong in the other general conductivity type. In the specification, however, the former general conductivity type is referred to simply as "N type," and the latter general conductivity type is referred to simply as "P type."

An N type epitaxial layer 3 is formed on a P type single-crystal silicon substrate 2. Note that this embodiment describes a case where one epitaxial layer 3 is formed on the substrate 2, but the preferred embodiment of the invention is not limited to this case. For example, multiple epitaxial layers may be stacked on the top surface of the substrate. The epitaxial layer 3 is divided into multiple element-forming regions by isolation regions 4. Each of the isolation regions 4 includes a P type buried layer 4A and a P type diffusion layer 4B. A diffusion depth (a downward expansion width) of the diffusion layer 4B from the top surface of the epitaxial layer 3 is smaller than a diffusion depth (an upward expansion width) of the buried layer 4A from the top surface of the substrate 2. Thereby, a forming region of the isolation region 4 is reduced in size.

An N type buried layer 5 is formed across both regions of the substrate 2 and the epitaxial layer 3. The N type buried layer 5 is formed in a process step of forming an N type buried layer 16 of the MOS transistor 15. Hence, the N type buried layer 5 and the N type buried layer 16 substantially share conditions such as an impurity concentration profile and an upward expansion depth.

A P type diffusion layer 6 is formed in the epitaxial layer 3. The P type diffusion layer 6 is formed in a process step of forming a P type diffusion layer 17 as a back-gate region of the MOS transistor 15. Hence, the P type diffusion layer 6 and the P type diffusion layer 17 substantially share conditions such as an impurity concentration profile and a diffusion depth. A P type diffusion layer 7 is formed to overlap the P type diffusion layer 6. The P type diffusion layer 7 is formed in a process step of forming a P type diffusion layer 18 as a back-gate lead-out region of the MOS transistor 15.

N type diffusion layers 8 are formed on the P type diffusion layer 6. The N type diffusion layers 8 are formed in a process step of forming N type diffusion layers 19 as source regions of the MOS transistor 15. Hence, the N type diffusion layers 8 and the N type diffusion layers 19 substantially share conditions such as an impurity concentration profile and a diffusion depth. Note that the N type diffusion layer 8 may be formed in a circle surrounding the P type diffusion layer 7.

An N type diffusion layer 9 is formed in the epitaxial layer 3. The N type diffusion layer 9 is formed in a process step of forming an N type diffusion layer 20 as a drain region of the MOS transistor 15. Hence, the N type diffusion layer 9 and the N type diffusion layer 20 substantially share conditions such as an impurity concentration profile and a diffusion depth.

An N type diffusion layer 10 is formed to overlap the N type diffusion layer 9. The N type diffusion layer 10 is formed in a process step of forming an N type diffusion layer 21 as a drain lead-out region of the MOS transistor 15. Note that the N type diffusion layer 9 may be formed in a circle surrounding the P type diffusion layer 6. Also, the N type diffusion layer 10 may be formed in a circle surrounding the P type diffusion layer 6.

An N type diffusion layer 11 is formed in the epitaxial layer 3. The N type diffusion layer 11 is formed in a circle outside of the N type diffusion layer 9 with respect to the P type diffusion layer 6, and is connected to the N type buried layer 5. An N type diffusion layer 12 is formed to overlap the N type diffusion layer 11.

Although not shown, an insulating layer such as a BPSG film and an SOG film is formed on the epitaxial layer 3. The protection element 1 is formed with use of the structure of the MOS transistor, so that a gate oxide film 13 and a gate electrode 14 are formed on the epitaxial layer 3. The gate oxide film 13 and the gate electrode 14 are formed in the same process steps as those of forming a gate oxide film 22 and a gate electrode 23 of the MOS transistor 15, respectively.

FIG. 2 shows a plan view of the protection element 1. A region between solid lines 24 and 25 represents the isolation region 4, and a region surrounded by the solid line 25 is a region in which the protection element 1 is formed. A region between broken lines 26 and 27 represents the N type diffusion layer 11 to serve as a current path for an avalanche current. A region between solid lines 28 and 29 represents the N type diffusion layer 12. The N type diffusion layers 11 and 12 are each formed in a circle inside of the isolation region 4.

A region between solid lines 30 and 31 represents the N type diffusion layer 9. A region between broken lines 32 and 33 represents the N type diffusion layer 10. A region surrounded by a broken line 34 represents the P type diffusion layer 6. A region surrounded by a solid line 35 represents the P type diffusion layer 7. Regions surrounded by a broken line 36 and a broken line 37 respectively represent the N type diffusion layers 8.

FIG. 3 shows an example of a circuit in which the MOS transistor 15 (refer to FIG. 1B) is connected between a power line (Vcc) and a ground (GND) and the protection element 1 (refer to FIG. 1A) is connected between the power line and an output terminal to protect the MOS transistor 15 from a surge voltage such as an ESD surge. Note that the protection element 1 includes PN diodes D1 and NPN transistors Tr1, as will be described in detail later.

Specifically, a drain electrode of the MOS transistor 15 is connected to the power line, and a source electrode of the MOS transistor 15 is connected to the ground (output terminal). The N type diffusion layers 11 and 12 (refer to FIG. 1A) of the protection element 1 are connected to the power line, and the N type diffusion layers 8 (refer to FIG. 1A) and the P type diffusion layers 6 and 7 (refer to FIG. 1A) are connected to the output terminal. As a result, the protection element 1 and the MOS transistor 15 are connected in parallel between the power line (Vcc) and the output terminal. With this circuit configuration, application of a surge voltage to the output terminal activates the protection element 1 first, and then the protection element 1 causes most of the avalanche currents generated by the surge voltage to be discharged to the power line (Vcc). Thus, a PN junction region of the MOS transistor 15 is prevented from being broken due to a surge voltage. Note that the surge voltage in this embodiment includes, in addition to the ESD surge, a surge voltage generated at the time of electric discharge in a cathode-ray tube or at the time of turning off an L load such as a motor load, for example.

Described below is a mechanism in which the protection element 1 is turned on prior to the MOS transistor 15 when a surge voltage is applied to the output terminal.

As shown in FIGS. 1A and 1B, a separation distance W1 between the P type diffusion layer 6 and the N type diffusion layer 9 of the protection element 1 is substantially the same as a separation distance W2 between the P type diffusion layer 17 and the N type diffusion layer 20 of the MOS transistor 15. As described above, the P type diffusion layer 6 and the P type diffusion layer 17 are formed in the same process step, and the N type diffusion layer 9 and the N type diffusion layer 20 are formed in the same process step. Therefore, even if a mask is misaligned at the time of layer formation, the misalignment widths are the same between these layers, and hence substantially the same separation distances W1 and W2 are obtained. Moreover, formation in the same process step allows the P type diffusion layer 6 to have substantially the same impurity concentration profile as the P type diffusion layer 17, and the N type diffusion layer 9 to have substantially the same impurity concentration profile as the N type diffusion layer 20. Because of this structure, an avalanche voltage of each of the PN diodes D1 formed of the P type diffusion layer 6 and the N type diffusion layer 9 of the protection element 1 is substantially the same as an avalanche voltage of each of PN diodes D2 formed of the P type diffusion layer 17 and the N type diffusion layer 20 of the MOS transistor 15. Note that, as described with reference to FIG. 3, a voltage applied to the PN diode D1 in the protection element 1 is substantially the same as a voltage applied to the PN diode D2 in the MOS transistor 15.

A diffusion depth W3 of each of the N type diffusion layers 8 of the protection element 1 is wider than a diffusion depth W4 of each of the N type diffusion layers 19 of the MOS transistor 15. The protection element 1 has parasitic NPN transistors Tr1 including the N type diffusion layers 8, the P type diffusion layers 6 and 7, and the N type buried layer 5 (including the N type epitaxial layer 3). In the same way, the MOS transistor 15 has parasitic NPN transistors Tr2 including the N type diffusion layers 19, the P type diffusion layers 17 and 18, and the N type buried layer 16 (including the N type epitaxial layer 3). Due to this structure, when an avalanche current flows through the protection element 1 and the MOS transistor 15 simultaneously, the avalanche current flows through the P type diffusion layer 6 under the N type diffusion layers 8 and through the P type diffusion layer 17 under the N type diffusion layers 19. Due to the structure of W3>W4 described above, a voltage drop in a base region is larger in each parasitic NPN transistor Tr1 of the protection element 1 than in each parasitic NPN transistor Tr2 of the MOS transistor 15. Accordingly, the parasitic NPN transistors Tr1 in the protection element 1 are turned on in preference to the parasitic NPN transistors Tr2 to allow an avalanche current to flow through the protection element 1. Thereby, the MOS transistor 15 is protected from the surge voltage.

In the protection element 1, the N type diffusion layers 11 and 12 are formed outside of the N type diffusion layers 9 and 10 with respect to the P type diffusion layer 6. The N type diffusion layers 11 and 12 are connected to the N type buried layer 5. An electrode (not shown) is formed on the N type diffusion layers 11 and 12 and is electrically connected to the drain electrode of the MOS transistor 15. In contrast, no electrode is formed on the N type diffusion layers 9 and 10 serving as floating diffusion layers. Due to this structure, the epitaxial layer 3 has a smaller parasitic resistance in its deep portion than in its top surface, and an avalanche current generated in the protection element 1 flows through the N type buried layer 5 and is drawn from the N type diffusion layers 11 and 12. In addition, since the N type diffusion layers 11 and 12 are arranged away from the N type diffusion layers 9 and 10, an avalanche current flows through the deep portion of the epitaxial layer 3, the deep portion being a current path. Accordingly, the top surface of the epitaxial layer 3 is protected from the thermal breakdown. Meanwhile, since an avalanche current flows through the deep portion of the epitaxial layer 3, a heat dissipation region spreads, and thereby the protection element 1 is protected from the thermal breakdown.

Being floating diffusion layers, N type diffusion layers 9 and 10 are applied with substantially the same potential as a drain potential of the MOS transistor 15, through the N type diffusion layers 11 and 12 and the N type epitaxial layer 3. Hence, as described above, a potential applied to the PN diode D1 in the protection element 1 and a potential applied to the PN diode D2 in the MOS transistor 15 are substantially the same.

In FIG. 4, the horizontal axis indicates a voltage applied to the protection element 1 and the MOS transistor 15, and the vertical axis indicates a current that flows through the protection element 1 and the MOS transistor 15. The solid line indicates the protection element 1 and the broken line indicates the MOS transistor 15.

At a voltage at a point A, an avalanche current occurs in the protection element 1 and the MOS transistor 15 substantially simultaneously as described above. The parasitic NPN transistors Tr1 in the protection element 1 are turned on by a voltage at a point B, and the parasitic NPN transistors Tr2 in the MOS transistor 15 are turned on by a voltage at a point C. This is because, as described above, with the larger diffusion width W3 (refer to FIG. 1A) of the N type diffusion layer 8 in the protection element 1, a potential drop in the base region is larger in each parasitic NPN transistor Tr1 of the protection element 1 than in each parasitic NPN transistor Tr2 of the MOS transistor 15. As a result, the parasitic NPN transistors Tr1 in the protection element 1 operate as bipolar transistors prior to the parasitic NPN transistors Tr2 in the MOS transistor 15. Thereby, an avalanche current flows to the power line through the protection element 1.

In this event, the parasitic NPN transistors Tr1 in the protection element 1 undergo conductivity modulation in the N type buried layer 5 and the N type diffusion layers 11 and 12 forming a collector region. Accordingly, a parasitic resistance in each of the parasitic NPN transistors Tr1 is significantly reduced to have an improved current capability. In other words, the parasitic NPN transistors Tr1 in the protection element 1 operate as bipolar transistors, and thereby obtain an improved capability of letting an avalanche current flow to the power line. In addition, the circular formation of the N type diffusion layers 11 and 12 in the protection element 1 prevents local concentration of an avalanche current and thereby prevents the protection element 1 from being destroyed by a large current.

The preferred embodiment of the invention describes the case where the following each pair of layers is formed in the same process step: the P type diffusion layers 6 and 17, the N type diffusion layers 8 and 19, the N type diffusion layers 9 and 20, and the N type diffusion layers 10 and 21. However, the preferred embodiment is not limited to the case above. Each of the above-described pairs of layers is not necessarily formed in the same process step as long as an avalanche voltage is substantially the same between the protection element 1 and the MOS transistor 15, and as long as the protection element 1 is turned on prior to the MOS transistor 15 when a surge voltage is applied to the output terminal. In addition, various modifications can be made without departing from the scope of the invention.

In the preferred embodiment of the invention, a part of the structure of a protection element is the same as a part of the structure of a to-be-protected element. This structure reduces variations between an avalanche voltage of the protection element and an avalanche voltage of the to-be-protected element, and prevents the to-be-protected element from being destroyed by a surge voltage.

In addition, in the preferred embodiment of the invention, a parasitic resistance in a base region is larger in a parasitic transistor in the protection element than in the to-be-protected element. This structure allows the protection element to be turned on prior to the to-be-protected element when the surge voltage is applied to an output terminal.

In addition, in the present invention, since a current path in the protection element runs in a deep portion of a semiconductor layer, a heat dissipation region spreads, and thereby the protection element is protected from the thermal breakdown.

In addition, in the preferred embodiment of the invention, the protection element operates as a bipolar transistor, and thereby obtains an improved current capability.

In addition, in the preferred embodiment of the invention, since the current path is arranged in a circle in an element forming region of the protection element, the protection element is prevented from being destroyed by concentrated current.

What is claimed is:

1. A semiconductor device comprising:
   a MOS transistor comprising a back-gate diffusion region of a first general conductivity type, a source diffusion layer of a second general conductivity type and a drain diffusion layer of the second general conductivity type; and
   a protection element electrically connected to the MOS transistor in parallel and comprising a first diffusion layer of the first general conductivity type, a second diffusion layer of the second general conductivity type formed in the first diffusion layer and a third diffusion layer of the second general conductivity type surrounding the first diffusion layer in plan view of the semiconductor device,
   wherein a lateral diffusion width of the second diffusion layer of the protection element is larger than a lateral diffusion width of the source diffusion layer of the MOS transistor.

2. The semiconductor device of claim 1, wherein a separation distance between the first diffusion layer and the third diffusion layer is equal to a separation distance between the back-gate diffusion layer and the drain diffusion layer.

3. The semiconductor device of claim 1, wherein the protection element further comprises a fourth diffusion layer of the second general conductivity type disposed outside the third diffusion layer with respect to the first diffusion layer and electrically connected to a drain electrode of the MOS transistor, and at least the first diffusion layer and the second diffusion layer are shorted to each other and are electrically connected to a source electrode of the MOS transistor.

4. The semiconductor device of claim 2, wherein the protection element further comprises a fourth diffusion layer of the second general conductivity type disposed outside the third diffusion layer with respect to the first diffusion layer and electrically connected to a drain electrode of the MOS transistor, and at least the first diffusion layer and the second diffusion layer are shorted to each other and are electrically connected to a source electrode of the MOS transistor.

5. The semiconductor device of claim 3, wherein the protection element further comprises a buried layer of the second general conductivity type and connected to the fourth diffusion layer.

6. The semiconductor device of claim 3, wherein the fourth diffusion layer surrounds the third diffusion layer in the plan view of the semiconductor device, and the third diffusion layer is configured to be floating.

7. The semiconductor device of claim 1, further comprising an isolation region of the first general conductivity type surrounding the third diffusion layer and comprising an upper diffusion layer and a lower diffusion layer connected to each other, a diffusion depth of the upper diffusion layer being smaller than a diffusion depth of the lower diffusion layer.

8. The semiconductor device of claim 3, further comprising an isolation region of the first general conductivity type surrounding the fourth diffusion layer and comprising an upper diffusion layer and a lower diffusion layer connected to each other, a diffusion depth of the upper diffusion layer being smaller than a diffusion depth of the lower diffusion layer.

9. The semiconductor device of claim 1, wherein an avalanche voltage between the first diffusion layer and the third diffusion layer of the protection element is equal to an avalanche voltage between the back-gate diffusion layer and the drain diffusion layer of the MOS transistor.

10. The semiconductor device of claim 1, wherein at least part of the back-gate diffusion region is disposed under the source diffusion layer.

* * * * *